(12) United States Patent
Kim et al.

(10) Patent No.: US 12,490,463 B2
(45) Date of Patent: Dec. 2, 2025

(54) SEMICONDUCTOR DEVICE

(71) Applicant: SAMSUNG ELECTRONICS CO., LTD., Suwon-si (KR)

(72) Inventors: Dahye Kim, Seoul (KR); Sujin Jung, Hwaseong-si (KR); Ingyu Jang, Seoul (KR); Jinbum Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 569 days.

(21) Appl. No.: 17/730,928

(22) Filed: Apr. 27, 2022

(65) Prior Publication Data
US 2023/0100189 A1 Mar. 30, 2023

(30) Foreign Application Priority Data

Sep. 24, 2021 (KR) .......................... 10-2021-0126342

(51) Int. Cl.
H10D 30/67 (2025.01)
H10D 62/10 (2025.01)
H10D 64/23 (2025.01)

(52) U.S. Cl.
CPC ..... H10D 30/6735 (2025.01); H10D 30/6757 (2025.01); H10D 62/118 (2025.01); H10D 64/258 (2025.01)

(58) Field of Classification Search
CPC ......... H01L 29/42392; H01L 29/41775; H01L 29/78696; H01L 21/322; H10D 30/67; H10D 30/6735
See application file for complete search history.

(56) References Cited

U.S. PATENT DOCUMENTS

| 9,536,881 | B2 | 1/2017 | Maeda et al. |
| 9,570,556 | B1* | 2/2017 | Lee ........ H01L 21/762 |
| 9,954,058 | B1 | 4/2018 | Mochizuki et al. |
| 10,128,379 | B2 | 11/2018 | Song et al. |
| 10,158,007 | B2 | 12/2018 | Lee et al. |
| 10,553,696 | B2 | 2/2020 | Ando et al. |

(Continued)

FOREIGN PATENT DOCUMENTS

| KR | 20110007115 A | 1/2011 |
| KR | 10-2018-0080527 A | 7/2018 |

(Continued)

Primary Examiner — Yara B Green
Assistant Examiner — Coralie A Nettles
(74) Attorney, Agent, or Firm — Wolf, Greenfield & Sacks, P.C.

(57) ABSTRACT

A semiconductor device includes a fin-type active region that protrudes from a substrate and extends in a first direction, a plurality of channel layers on the fin-type active region that are spaced apart from each other in a second direction that is perpendicular to an upper surface of the substrate, a gate structure that intersects the fin-type active region, extends in the second direction, and surrounds each of the plurality of channel layers in a third direction, fence spacers on side surfaces of the fin-type active region in the second direction on sides of the gate structure and extending in the second direction, and a source/drain region between the fence spacers on the fin-type active region at sides of the gate structure, connected to each of the plurality of channel layers, and having voids in side surfaces adjacent the fence spacers.

18 Claims, 17 Drawing Sheets

(56) References Cited

U.S. PATENT DOCUMENTS

| | | | |
|---|---|---|---|
| 10,879,128 B2 | 12/2020 | Kwok et al. | |
| 11,037,926 B2 | 6/2021 | Suh et al. | |
| 2009/0246921 A1 | 10/2009 | Cheng et al. | |
| 2017/0054023 A1* | 2/2017 | Li | H10D 62/822 |
| 2018/0190829 A1* | 7/2018 | Song | H01L 21/02532 |
| 2019/0273153 A1* | 9/2019 | Cho | H10D 84/853 |
| 2019/0355585 A1* | 11/2019 | Chang | H10D 30/024 |
| 2020/0126798 A1* | 4/2020 | Lin | H10D 30/014 |
| 2020/0403064 A1 | 12/2020 | Baek et al. | |
| 2021/0091181 A1* | 3/2021 | Keech | H10D 30/6735 |
| 2021/0202758 A1 | 7/2021 | Yeong et al. | |
| 2021/0305365 A1* | 9/2021 | Ma | H01L 24/43 |
| 2022/0059703 A1* | 2/2022 | More | H10D 84/017 |
| 2022/0238717 A1* | 7/2022 | Ju | H10D 30/014 |

FOREIGN PATENT DOCUMENTS

| | | |
|---|---|---|
| KR | 10-2019-0021102 A | 3/2019 |
| KR | 10-2020-0066161 A | 6/2020 |
| KR | 10-2020-0086606 A | 7/2020 |
| KR | 102183131 B1 | 11/2020 |

\* cited by examiner

SEMICONDUCTOR DEVICE

CROSS-REFERENCE TO RELATED APPLICATION(S)

This application claims benefit of priority to Korean Patent Application No. 10-2021-0126342 filed on Sep. 24, 2021 in the Korean Intellectual Property Office, the disclosure of which is incorporated herein by reference in its entirety.

BACKGROUND

The present inventive concept relates to a semiconductor device.

While demands for high performance, high speed, and/or multifunctionality of a semiconductor device increase, demand for a degree of integration of the semiconductor device is also increasing. Development of a semiconductor device having a channel with a three-dimensional structure is being actively conducted to meet the demand for high integration of the semiconductor device.

SUMMARY

An aspect of the present inventive concept is to provide a highly integrated semiconductor device.

According to some embodiments of the present inventive concept, a semiconductor device includes a fin-type active region that protrudes from a substrate and extends in a first direction, a plurality of channel layers on the fin-type active region that are spaced apart from each other in a second direction that is perpendicular to an upper surface of the substrate, a gate structure that intersects the fin-type active region, extends in the second direction, and surrounds each of the plurality of channel layers in a third direction parallel to the upper surface of the substrate, fence spacers on side surfaces of the fin-type active region in the second direction on sides of the gate structure, and extend in the second direction, and a source/drain region between the fence spacers on the fin-type active region, and connected to each of the plurality of channel layers, and the fence spacers have voids in side surfaces of the source/drain regions that are adjacent the fence spacers.

According to some embodiments of the present inventive concept, a semiconductor device includes a fin-type active region that protrudes from a substrate and extends in a first direction, a plurality of channel layers on the fin-type active region that are spaced apart from each other in a second direction that is perpendicular to an upper surface of the substrate a gate structure that intersects the fin-type active region, extends in the second direction, and surrounds each of the plurality of channel layers in a third direction parallel to the upper surface of the substrate, a source/drain region including a first epitaxial layer on the fin-type active region at sides of the gate structure and extending onto side surfaces of the plurality of channel layers, and a second epitaxial layer on the first epitaxial layer and that has a composition that is different from a composition of the first epitaxial layer, and fence spacers on side surfaces of the fin-type active region in the second direction at sides of the gate structure, and extend in the second direction. The source/drain region has a shape that is asymmetrical in the third direction and the source/drain region has an aspect ratio of a cross-section of the source/drain region in the first direction is 2.5 or more, and each of the fence spacers has a height an upper end level that is 30% or more of a height of the source/drain region.

According to some embodiments of the present inventive concept, a semiconductor device includes a fin-type active region that protrudes from a substrate and extends in a first direction, a plurality of channel layers on the fin-type active region that are spaced apart from each other in a second direction that is perpendicular to an upper surface of the substrate a gate structure that intersects the fin-type active region, extends in the second direction, and surrounds each of the plurality of channel layers in a third direction parallel to the upper surface of the substrate, a source/drain region including a first epitaxial layer on the fin-type active region, at sides of the gate structure, and that extends onto side surfaces of the plurality of channel layers, and a second epitaxial layer on the first epitaxial layer and that has a composition that is different from a composition of the first epitaxial layer, and fence spacers on side surfaces of the fin-type active region in the second direction on sides of the gate structure and that extend in the second direction. The source/drain region has concave voids in side surfaces adjacent the fence spacers, and the side surfaces adjacent the fence spacers of the source/drain region are portions of the second epitaxial layer.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, various embodiments of the present inventive concept will be described in detail with reference to the accompanying drawings.

Figure 1:
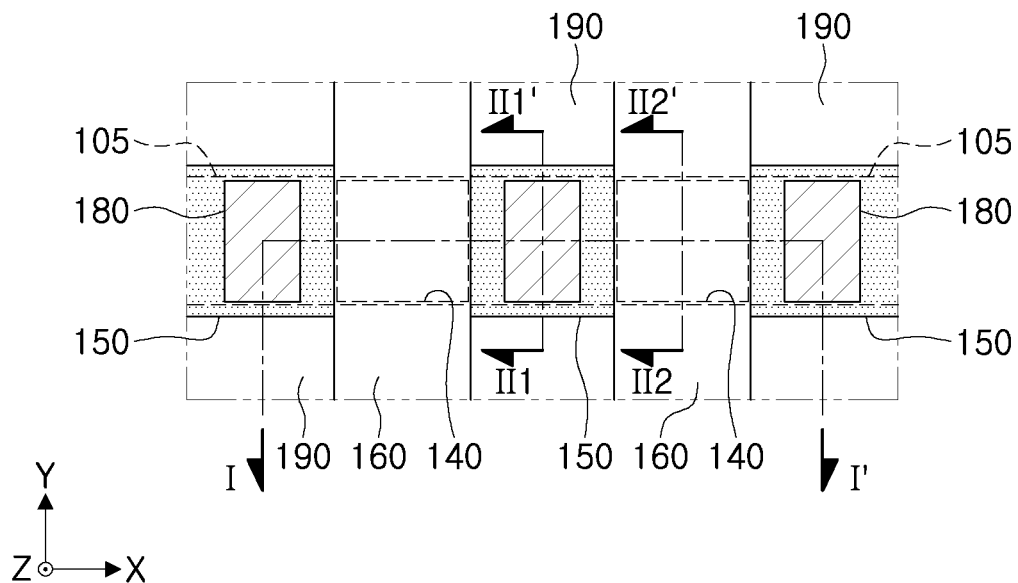
FIG. 1 is a plan view illustrating a semiconductor device according to some embodiments of the present inventive concept.
Figure 2:
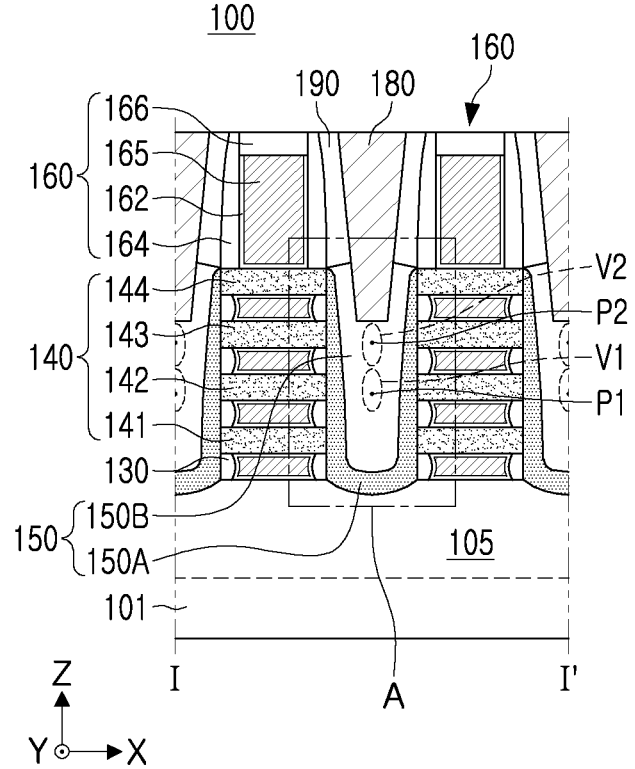
FIG. 2 is a cross-sectional view of the semiconductor device of FIG. 1, taken along line I-I'.
Figure 3A:
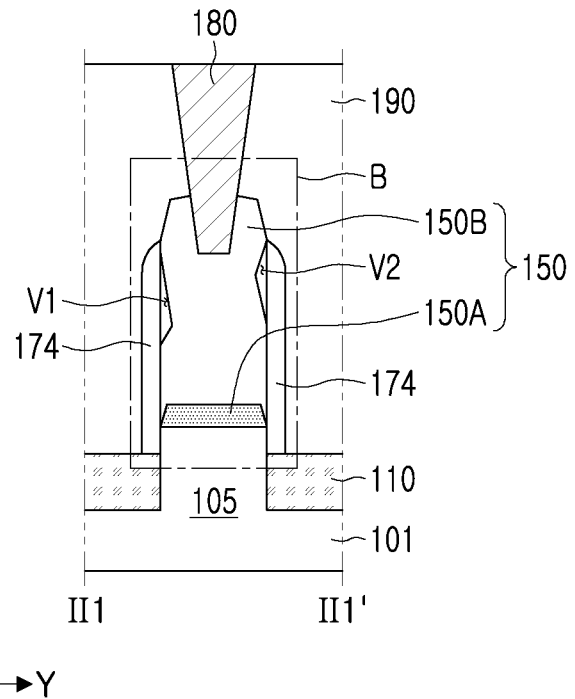
FIGS. 3A and 3B are cross-sectional views of the semiconductor device of FIG. 1, taken along lines II1-II1' and II2-II2'.
Figure 3B:
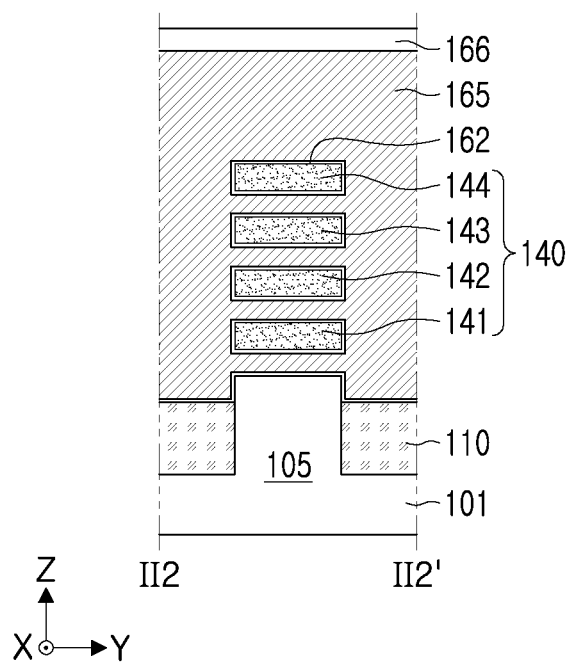
Figure 4A:
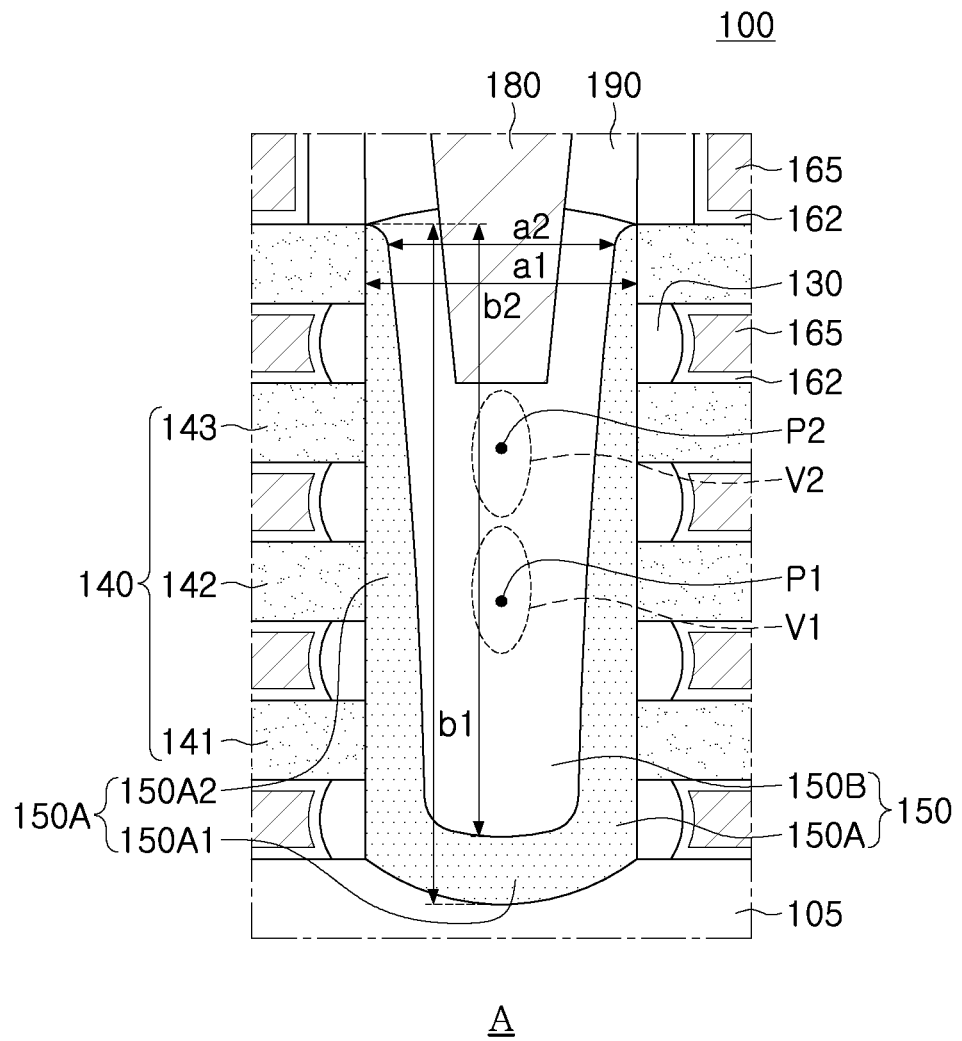
FIGS. 4A and 4B are partially enlarged views of portion "A" of FIG. 2 and portion "B" of FIG. 3B, respectively.

FIG. 1 is a plan view illustrating a semiconductor device according to some embodiments of the present inventive concept, FIG. 2 is a cross-sectional view of the semiconductor device of FIG. 1, taken along line I-I', FIGS. 3A and 3B are cross-sectional views of the semiconductor device of FIG. 1, taken along lines II1-II1' and II2-II2', and FIGS. 4A and 4B are partial enlarged views of portion "A" of FIG. 2 and portion "B" of FIG. 3B, respectively.

Referring to FIGS. 1 and 2, a semiconductor device 100 according to some embodiments may include a substrate 101, a fin-type active region 105 protruding from the substrate 101 and extending in a first direction (e.g., an X-direction), a channel structure 140 disposed on the fin-type active region 105, and a gate structure 160 intersecting the fin-type active region 105 to extend in a second direction (e.g., an Y-direction). The channel structure 140 may include a plurality of channel layers 141, 142, 143, and 144 disposed on the fin-type active region 105 to be spaced apart from each other in a vertical direction (e.g., a Z-direction), perpendicular to an upper surface of the substrate 101.

In addition, the semiconductor device 100 may further include source/drain regions 150 disposed on both sides of the gate structure 160 to contact the plurality of channel layers 141, 142, 143, and 144, and contact plugs 180 connected to the source/drain regions 150.

In the present embodiment, the fin-type active region 105 may extend in the first direction (e.g., the X-direction), and may have a protruding fin structure. For example, the substrate 101 may be a semiconductor substrate such as a silicon substrate or a germanium substrate, or a silicon-on-insulator (SOI) substrate. A device isolation film 110 may define the fin-type active region 105. As illustrated in FIGS. 3A and 3B, the device isolation film 110 may be disposed on the substrate 101 to cover or overlap side surfaces of the fin-type active region 105 of the substrate 101. The device isolation film 110 may include, for example, an oxide film, a nitride film, or a combination thereof. In some embodiments, the device isolation film 110 may include a deep trench isolation (DTI) region (not illustrated) defining an active region in which a fin structure is formed and may be formed deeper than a shallow trench isolation (STI) region, in addition to the STI defining the fin-type active region 105.

The device isolation film 110 may be formed to expose an upper portion of the fin-type active region 105. In some embodiments, the device isolation film 110 may have a curved upper surface having a higher level, as it approaches the fin-type active region 105.

Referring to FIG. 2, FIG. 3A, and/or FIG. 3B, the upper portion of the fin-type active region 105 may protrude from an upper surface of the device isolation film 110. The fin-type active region 105 may include a portion of the substrate 101 or an epitaxial layer grown from the substrate 101. A portion of the fin-type active region 105 on the substrate 101 located on both sides of the gate structures 160 may be exposed (or recessed), and the source/drain regions 150 may be formed in the exposed region. Details of the source/drain regions 150 employed in the present embodiment will be described later.

As illustrated in FIG. 2, FIG. 3A, and/or FIG. 3B, the gate structure 160 may include a gate electrode 165 extending in the second direction (e.g., the Y-direction) and surrounding the plurality of channel layers 141, 142, 143, and 144, a gate dielectric layer 162 disposed between the gate electrode 165 and the plurality of channel layers 141, 142, 143, and 144, gate spacers 164 disposed on side surfaces of the gate electrode 165, and a gate capping layer 166 disposed on the gate electrode 165.

As described above, the semiconductor device 100 according to the present embodiment may be a gate-all-around (GAA) type field effect transistor (e.g., a P-MOS transistor) including the channel structure 140, the source/drain regions 150, and the gate structure 160.

Specifically, the channel structure 140 may include first to fourth channel layers 141, 142, 143, and 144 disposed on the fin-type active region 105 to be spaced apart from each other in a third direction (e.g., the Z-direction), perpendicular to the upper surface of the substrate 101. Both side surfaces of the first to fourth channel layers 141, 142, 143, and 144 in the first direction (e.g., the X-direction) may be in contact with the source/drain region 150.

Each of the first to fourth channel layers 141, 142, 143, and 144 may have a width, identical or similar to a width of the fin-type active region 105 in the second direction (e.g., the Y-direction), and identical or similar to a width of the gate structure 160 in the first direction (e.g., X-direction), but the present inventive concept is not limited thereto, and in some embodiments, the widths of the first to fourth channel layers 141, 142, 143, and 144 may be slightly different. For example, a width of the first channel layer 141 may be greater than a width of the second channel layer 142. Also, in some embodiments, when viewed in the first direction (e.g., the X-direction), the width of each of the first to fourth channel layers 141, 142, 143, and 144 may be formed to be smaller than a width of the gate structure 160 such that side surfaces of the first to fourth channel layers 141, 142, 143, and 144 are located below the gate structure 160.

The first to fourth channel layers 141, 142, 143, and 144 may include a semiconductor material capable of providing a channel region. For example, the first to fourth channel layers 141, 142, 143, and 144 may include at least one of silicon (Si), silicon germanium (SiGe), and germanium (Ge). The first to fourth channel layers 141, 142, 143, and 144 may be formed of, for example, the same material as the substrate 101. In the present embodiment, although the number of channel layers is illustrated as being four (4), i.e., 141, 142, 143, and 144, the number and shapes of the channel layers may be variously changed (see FIGS. 17A and 17B).

As the number of the channel layers (e.g., 141, 142, 143, and 144) increases, an aspect ratio of the source/drain region may increase. In the present embodiment, the aspect ratio of the source/drain region 150 may relatively increase by introducing the four channel layers 141, 142, 143, and 144. In a cross-section in the first direction (e.g., the X-direction) (see FIGS. 2 and 4A), an aspect ratio b1/a1 of the source/drain region 150 may be 2.5 or more, and in some embodiments, may be 2.8 or more (e.g., 3). Referring to FIG. 4A, a horizontal length a1 may be defined as an interval between adjacent fourth channel layers 144, and a vertical length b1 may be defined as a depth of a recess for the source/drain region 150 (see 'RC' in FIG. 9).

Figure 4B:
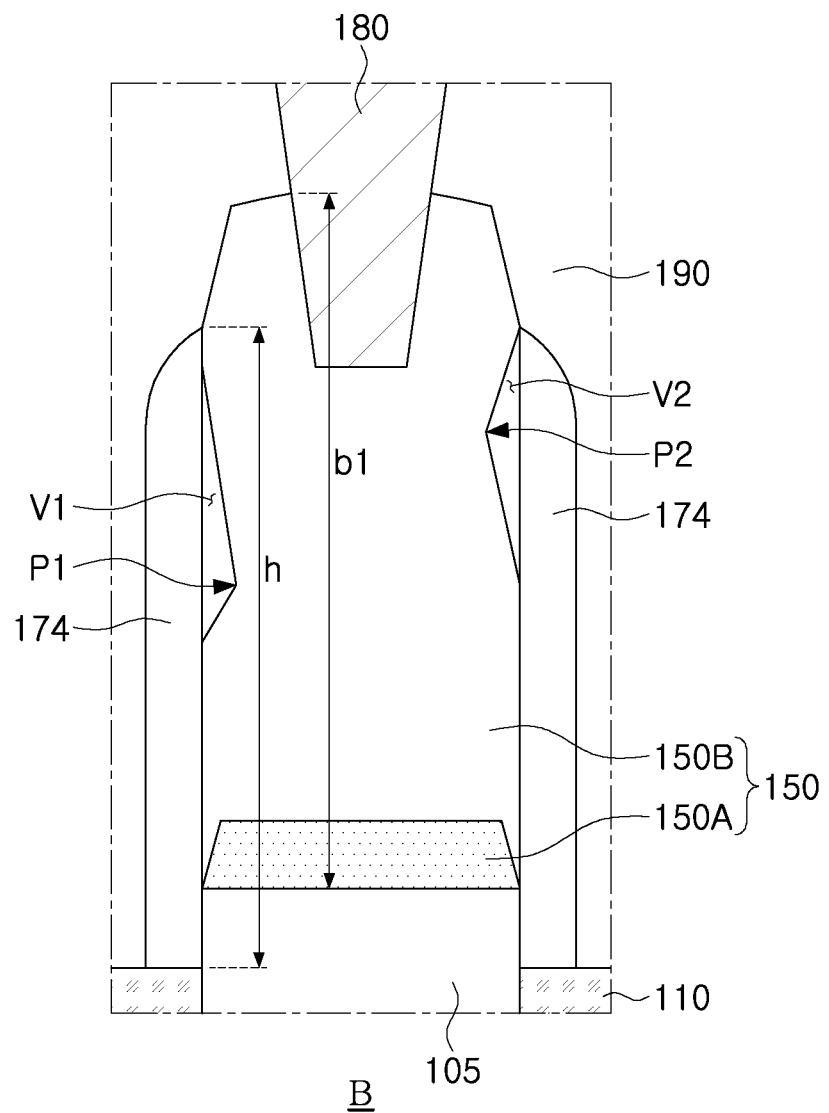

Referring to FIGS. 3A and 4B, the semiconductor device 100 may further include fence spacers 174 respectively disposed on both side surfaces of the fin-type active region 105 in the second direction (e.g., the Y-direction), on both sides of the gate structure 160, and extending in the third direction (e.g., the Z-direction). The source/drain regions 150 may be disposed between the fence spacers 174, and may be respectively connected to both side surfaces of the channel layers (i.e., 141, 142, 143, and/144 of channel structure 140).

The fence spacers 174 may have a sufficient height to guide growth of a source/drain region 150 in the second direction (e.g., the Y-direction). Referring to FIG. 4B, the fence spacers 174 may be formed to have an upper end level equal to 30% or more of the height b1 of the source/drain region 150. As in the present embodiment, the fence spacers 174 may have an upper end level of 50% or more of the height b1 of the source/drain region 150. For example, a height h of each of the fence spacers 174 may be 30 nm or more.

In a process of forming the source/drain region 150 (refer to FIGS. 12 to 14), since gas may not be smoothly introduced by the fence spacers 174, portions of the source/drain region 150 in a lateral direction, adjacent to each of the fence spacers 174, may not be completely filled. As a result, as illustrated in FIGS. 3A and 4B, the source/drain region 150 may have concave voids V1 and V2 respectively formed in both side surfaces opposing the fence spacers 174.

In a process of filling an intermediate through-region (TV in FIG. 13) called "pinch-off void," dislocation defects may be observed at points P1 and P2 in which epitaxial portions grown in different directions merge. The voids V1 and V2 respectively located on the opposite side surfaces may be located on different levels. The voids V1 and V2 located in both side surfaces may have different shapes and/or sizes. As illustrated in FIGS. 3A and 4B, the source/drain region 150 may be asymmetrical in right and left directions.

In the present embodiment, a width of the source/drain region 150 in the second direction (e.g., the Y-direction) may be defined by an interval between the fence spacers 174, but the present inventive concept is not limited thereto. In (see FIG. 19), an upper region of the source/drain regions 150 may have a width, greater than the interval between the fence spacers 174.

Referring to FIGS. 2 and 3A, the source/drain region 150 employed in the present embodiment may include a first epitaxial layer 150A continuously disposed on an upper surface region of the fin-type active region 105 on both sides of the gate structure 160 and side surfaces of each of the channel layers 141, 142, 143, and 144, and a second epitaxial layer 150B disposed on the first epitaxial layer 150A. From a process point of view (refer to FIG. 12), the first epitaxial layer 150A may be formed on the bottom and side surfaces of a recess in the first direction (e.g., the X-direction), and the second epitaxial layer 150B may be disposed on the first epitaxial layer 150A to fill a remaining space of the recess, and may provide a region connected to the contact plug 180.

The first epitaxial layer 150A may have a bottom region 150A1 located on the upper surface of the fin-type active region 105, and a sidewall region 150A2 that continuously extends from the bottom region 150A1 along side surfaces of the first to fourth channel layers 141, 142, 143, and 144 in the first direction (e.g., the X-direction). In some embodiments, a thickness of the bottom region 150A1 may be somewhat greater than a thickness of the sidewall region 150A2. The second epitaxial layer 150B may have a slightly convex shape, but the present inventive concept is not limited thereto.

In the source/drain region 150, both side surfaces located in the first direction (e.g., the X-direction) may be provided by the first epitaxial layer 150A (see FIG. 3A), and both side surfaces located in the second direction (e.g., the Y-direction) direction), e.g., side surfaces on which the voids V1 and V2 are formed may be provided by the second epitaxial layer 150B (refer to FIG. 3A).

As described above, the aspect ratio b1/a1 of the source/drain region 150 may be 2.5 or more, and in some embodiments may be 2.8 or more (e.g., 3). An aspect ratio of the recess after the first epitaxial layer 150A is formed, e.g., an aspect ratio b2/a2 of the second epitaxial layer 150B may be 2.0 or more, and in some embodiments, 2.3 or more (e.g., 2.5).

In the present embodiment, the first epitaxial layer 150A and the second epitaxial layer 150B may have different compositions. For example, the first and second epitaxial layers 150A and 150B may include at least one of silicon (Si), silicon germanium (SiGe), or silicon carbide (SiC), and (or) may have different impurity concentrations. For example, in a P-MOSFET, P-type impurity may include at least one of B, Al, Ga, or In.

In some embodiments (e.g., P-MOSFET), the first epitaxial layer 150A may include silicon germanium (SiGe) containing Ge in a first composition ratio, and the second epitaxial layer 150B may include silicon germanium containing Ge in a second composition ratio, higher than the first composition ratio. For example, a Ge composition ratio of SiGe, which may be the first epitaxial layer 150A, may be 15% or less, further 10% or less, and a Ge composition ratio of SiGe, which may be the second epitaxial layer 150B, may be 20% or more.

As described above, the gate structure 160 may include a gate dielectric layer 162, a gate electrode 165, gate spacers 164, and a gate capping layer 166.

As illustrated in FIG. 2, the gate dielectric layer 162 may be disposed between the fin-type active region 105 and the gate electrode 165 and between the channel structure 140 and the gate electrode 165. The gate dielectric layer 162 may be formed to surround the channel layers 141, 142, 143, and 144 in the second direction (e.g., the Y-direction), and may extend from an upper surface of the fin-type active region 105 to an upper surface of the device isolation film 110 (See FIG. 3B). As illustrated in FIG. 2, the gate dielectric layer 162 may extend between the gate electrode 165 and the gate spacers 164. For example, the gate dielectric layer 162 may include an oxide, a nitride, or a high-k material. The high-k material may refer to a dielectric material having a dielectric constant, higher than a dielectric constant of a silicon oxide layer ($SiO_2$). The high-k material may be, for example, at least one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), or praseodymium oxide ($Pr_2O_3$).

The gate electrode 165 may be disposed on the fin-type active region 105 to fill or at least partially a space between the plurality of channel layers 141, 142, 143, and 144, and extend to an upper portion of the channel structure 140. The gate electrode 165 may be spaced apart from the plurality of channel layers 141, 142, 143, and 144 by the gate dielectric layer 162. The gate electrode 165 may include a conductive material, for example, a metal nitride such as titanium nitride (TiN), tantalum nitride (TaN), or tungsten nitride (WN), and/or a metal material such as aluminum (Al), tungsten (W), molybdenum (Mo), or the like, or a semiconductor material such as doped polysilicon. In some embodiments, the gate electrode 165 may include two or more multilayers. In some embodiments, the gate electrode 165 may be disposed between adjacent transistors, and the gate electrode 165 may be separated by a separate isolation portion located between the adjacent transistors.

The gate spacers 164 may be disposed on both side surfaces of the gate electrode 165. The gate spacers 164 may insulate source/drain regions 150 from gate electrodes 165. In some embodiments, the gate spacers 164 may have a multilayer structure. For example, the gate spacers 164 may include an oxide, a nitride, or an oxynitride, and in particular, a low-K film. The fence spacers 174 employed in the present embodiment may include the same material as that of the gate spacers 164. The gate capping layer 166 may be disposed on the gate electrode 165, and lower and side surfaces of the gate capping layer 166 may be surrounded by the gate electrode 165 and the gate spacers 164, respectively.

In the present embodiment, the semiconductor device 100 may further include internal spacers 130 disposed on both side surfaces of the gate electrode 165 between the channel layers 141, 142, 143, and 144, as illustrated in FIG. 2. Below the third channel layer 143, the gate electrode 165 may be spaced apart from the source/drain regions 150 by the internal spacers 130, to be electrically isolated from each other. The internal spacers 130 may have a curved surface in which a side surface contacting the gate electrode 165 is convex toward the gate electrode 165, but the present inventive concept is not limited thereto. For example, the internal spacers 130 may include an oxide, a nitride, or an oxynitride. In particular, the internal spacers 130 may be formed of a low-K film.

The contact plug 180 may pass through an interlayer insulating layer 190 to be connected to the source/drain region 150, and may apply an electrical signal to the source/drain region 150. The contact plug 180 may be disposed on the source/drain region 150, as illustrated in FIGS. 1 and 2. In some embodiments, the contact plug 180 may be disposed to have a length in the second direction (e.g., the Y-direction), longer than a length of the source/drain region 150. The contact plug 180 may have a structure in which a width of a lower portion thereof is narrower than a width of an upper portion thereof, but the present inventive concept is not limited thereto. The contact plug 180 may extend from the upper portion to, for example, to a lower height than the fourth channel layer 144. The contact plug 180 may be recessed to a height corresponding to an upper surface of the third channel layer 143, for example. For example, the contact plug 180 may include a metal nitride such as titanium nitride (TiN), tantalum nitride (TaN), or tungsten nitride (WN), and/or a metal material such as aluminum (Al), tungsten (W), or molybdenum (Mo).

The interlayer insulating layer 190 may cover or overlap the source/drain regions 150 and the gate structures 160, and may be disposed to cover or overlap the device isolation film 110 in a region not illustrated. For example, the interlayer insulating layer 190 may include at least one of an oxide, a nitride, or an oxynitride, and may include a low-K material.

Hereinafter, a method of manufacturing a semiconductor device according to the present embodiment will be described in detail with reference to FIGS. 5 to 16.

FIGS. 5 to 8 are perspective views illustrating a portion of forming a fin structure and a dummy gate in a method of manufacturing a semiconductor device according to some embodiments of the present inventive concept, and FIGS. 9 to 16 are cross-sectional views illustrating a portion of forming a source/drain and a gate structure in a method of manufacturing a semiconductor device according to some embodiments of the present inventive concept.

Figure 5:
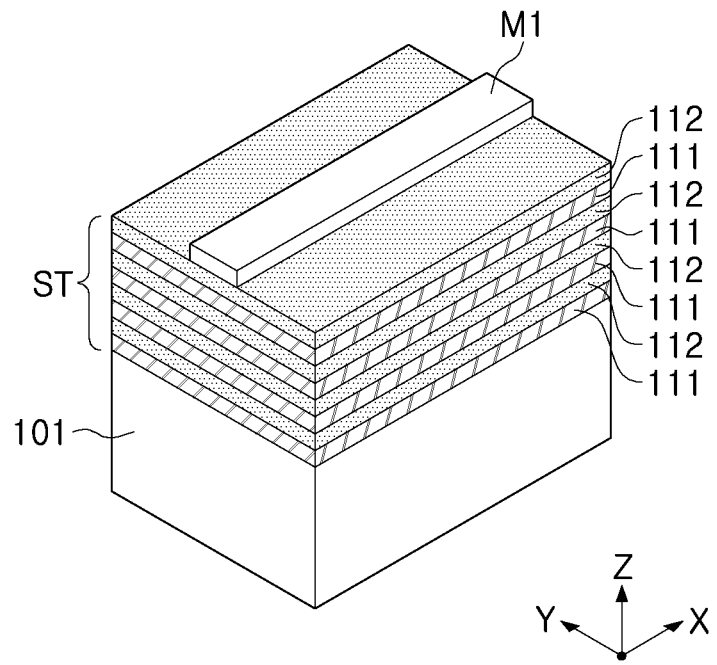
FIGS. 5 to 8 are perspective views illustrating a portion (forming a fin structure and a dummy gate) of a method of manufacturing a semiconductor device according to some embodiments of the present inventive concept.

First, referring to FIG. 5, a semiconductor stack ST in which first semiconductor layers 111 and second semiconductor layers 112 are alternately stacked on a substrate 101 may be formed.

The first semiconductor layers 111 may be removed in a subsequent process to be used as a sacrificial layer, and the second semiconductor layers 112 may be used as a channel layer. The first semiconductor layers 111 and the second semiconductor layers 112 may include a semiconductor material including at least one of silicon (Si), silicon germanium (SiGe), or germanium (Ge), but may include different semiconductor materials. The first semiconductor layers 111 may be formed of a material having etch selectivity with respect to the second semiconductor layers 112. The second semiconductor layers 112 may include impurities, but the present inventive concept is not limited thereto. In some embodiments, the first semiconductor layers 111 may include silicon germanium (SiGe), and the second semiconductor layers 112 may include silicon (Si). The first semiconductor layers 111 and the second semiconductor layers 112 may be formed by performing an epitaxial growth process on the substrate 101. Each of the first semiconductor layers 111 and each of the second semiconductor layers 112 may have a thickness in a range of about 1 Å to 100 nm, respectively.

Figure 6:
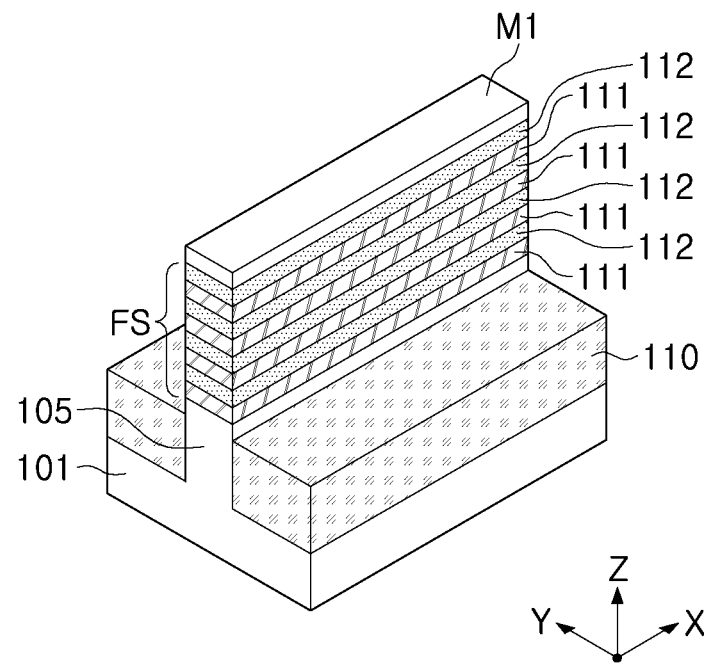

Next, referring to FIG. 6, a portion of the semiconductor stack ST and the substrate 101 may be removed using a first mask pattern M1 extending in the first direction (e.g., the X-direction) to form an active structure.

The active structure may include a fin-type active region 105 and a fin structure FS. The fin-type active region may include a structure in which a portion of the substrate 101 is removed to protrude from an upper surface of the substrate 101, and the fin structure FS may include the first semiconductor layers 111 and the second semiconductor layers 112, alternately stacked on the fin-type active region 105. The fin-type active region 105 and the fin structure FS may be formed in a linear shape extending in one direction, for example, the first direction (e.g., the X-direction).

In a region from which a portion of the substrate 101 is removed, a device isolation film 110 may be formed by burying an insulating material and then performing etch-back to protrude a portion of the fin-type active region 105. For example, an upper surface of the device isolation film 110 may be etched back to be lower than an upper surface of the fin-type active region 105.

Figure 7:
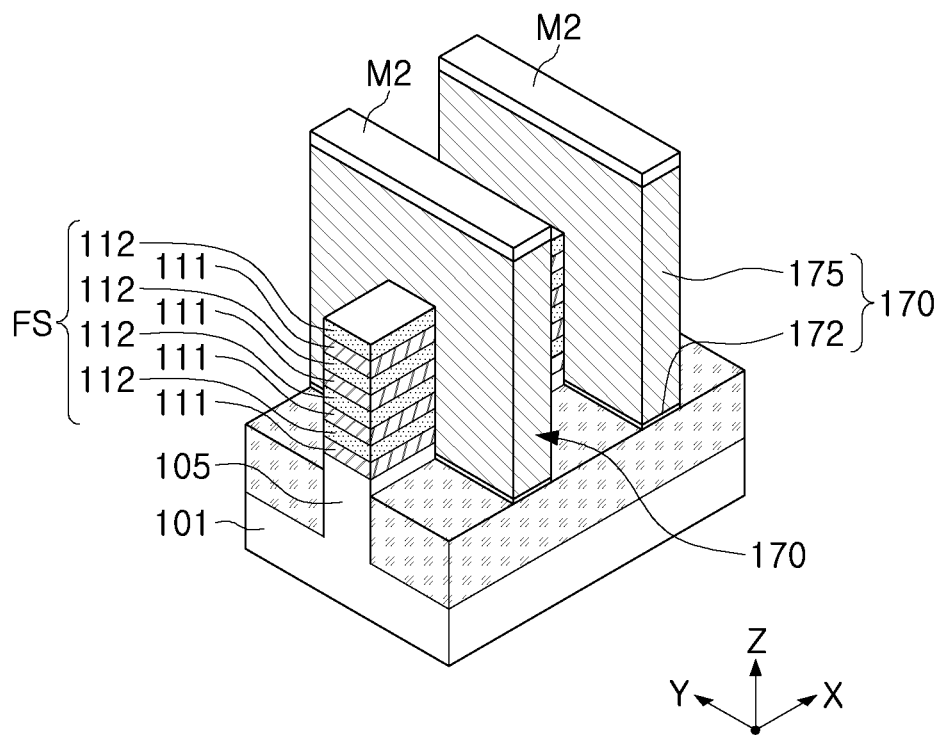

Next, referring to FIG. 7, sacrificial gate structures 170 may be formed to cross a partial region of the active structure, and gate spacers 164 and fence spacers 174 may be respectively formed on both side surfaces of the sacrificial gate structures 170 and both side surfaces of the active structure.

The sacrificial gate structures 170 may be sacrificial structures formed in a region in which a gate dielectric layer 162 and a gate electrode 165 are disposed on the channel structures 140 illustrated in FIG. 2 by a subsequent process. The sacrificial gate structures 170 may have a linear shape extending in the second direction (e.g., the Y-direction) to cross the active structures, and may be arranged to be spaced apart from each other in the first direction (e.g., the X-direction). After forming first and second sacrificial gate layers 172 and 175, sequentially stacked on the substrate 101 (in particular, the device isolation film 110) on which the active structure is formed, a resulted stack body may be patterned using a second mask pattern M2, to form the sacrificial gate structures 170 as illustrated in FIG. 7.

The first and second sacrificial gate layers 172 and 175 may be an insulating layer and a conductive layer, respectively, but the present inventive concept is not limited thereto, and the first and second sacrificial gate layers 172 and 175 may be formed of a single layer. In some embodiments, the first sacrificial gate layer 172 may include silicon oxide, and the second sacrificial gate layer 175 may include polysilicon. The second mask pattern M2 may include silicon oxide and/or silicon nitride.

Next, after conformally forming a spacer material layer on the sacrificial gate structure and the active structure, anisotropic etching may be applied to form the gate spacers 164 on both side surfaces of the sacrificial gate structures 170, and form the fence spacers 174 on both side surfaces of the active structure, e.g., on both side surfaces of the fin-type active region 105 and both side surfaces the fin structure FS. Both side surfaces on which the gate spacers 164 are formed may be opposite side surfaces of the sacrificial gate structures 170 in the first direction (e.g., the X-direction), and both side surfaces on which the fence spacers 174 are formed may be opposite side surfaces of the active structure in the second direction (e.g., the Y-direction). Also, the gate spacers 164 and the fence spacers 174 may be formed of the same material. The spacer material layer, e.g., the gate spacers 164 and the fence spacers 174 may be formed of a low-K material, and may include, for example, at least one of SiO, SiN, SiCN, SiOC, SiON, or SiOCN.

FIGS. 9 to 16 are cross-sectional views illustrating processes of forming internal spacers, source/drain regions, and a gate structure, as a portion of forming a source/drain and a gate structure in a method of manufacturing a semiconductor device according to some embodiments of the present inventive concept.

Figure 9:
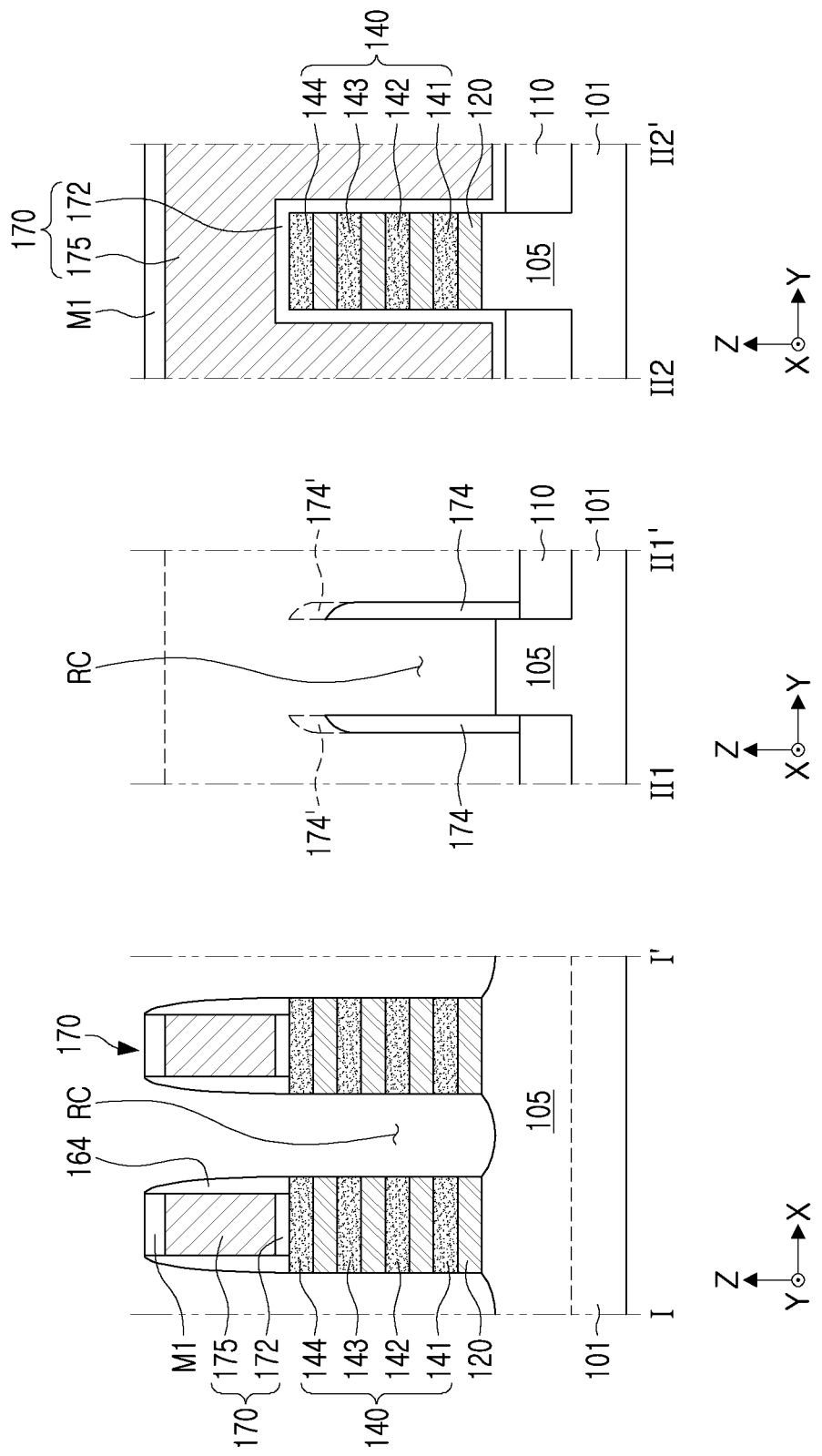
FIGS. 9 to 16 are cross-sectional views illustrating a portion (forming a source/drain and a gate structure) of a method of manufacturing a semiconductor device according to some embodiments of the present inventive concept.

Referring to FIG. 9, channel structures 140 may be prepared by removing sacrificial layers 120 and channel layers 141, 142, 143, and 144 between sacrificial gate structures 170 to form a recess RC.

Figure 8:
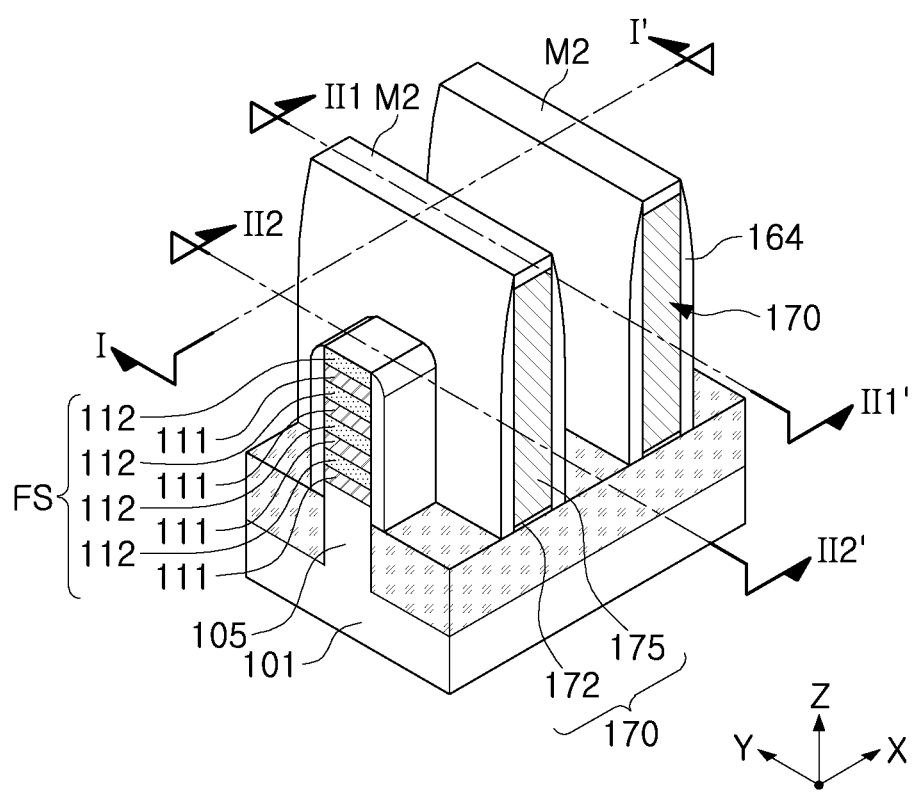

In this case, the sacrificial layers 120 may correspond to the first semiconductor layer 111 illustrated in FIG. 8, and the channel layers 141, 142, 143, and 144 may correspond to the second semiconductor layer 112 illustrated in FIG. 8. A portion of the sacrificial layers 120 and a portion of the channel layers 141, 142, and 143, exposed using a second mask pattern M2 and gate spacers 164 as masks, may be removed. By this process, lengths of the channel layers 141, 142, and 143 in the first direction (e.g., the X-direction) may be determined. Below the sacrificial gate structures 170, the sacrificial layers 120 and the channel structure 140 may be partially removed in a lateral direction such that both side surfaces thereof in the first direction (e.g., the X-direction) are formed below the sacrificial gate structures 170 and the gate spacers 164. Also, after this process, fence spacers 174 located on both sides of the active structure may remain. In the process of removing the exposed portions of the sacrificial layers 120 and the channel layers 141, 142, and 143, a portion of the fence spacers 174 (indicated by dotted lines) may be lost, and thus heights of the final fence spacers 174 may be determined. In a cross-section in the first direction (e.g., X-direction), an aspect ratio of the recess RC formed in the present process may be 2.5 or more, and in some embodiments, 2.8 or more.

Figure 10:
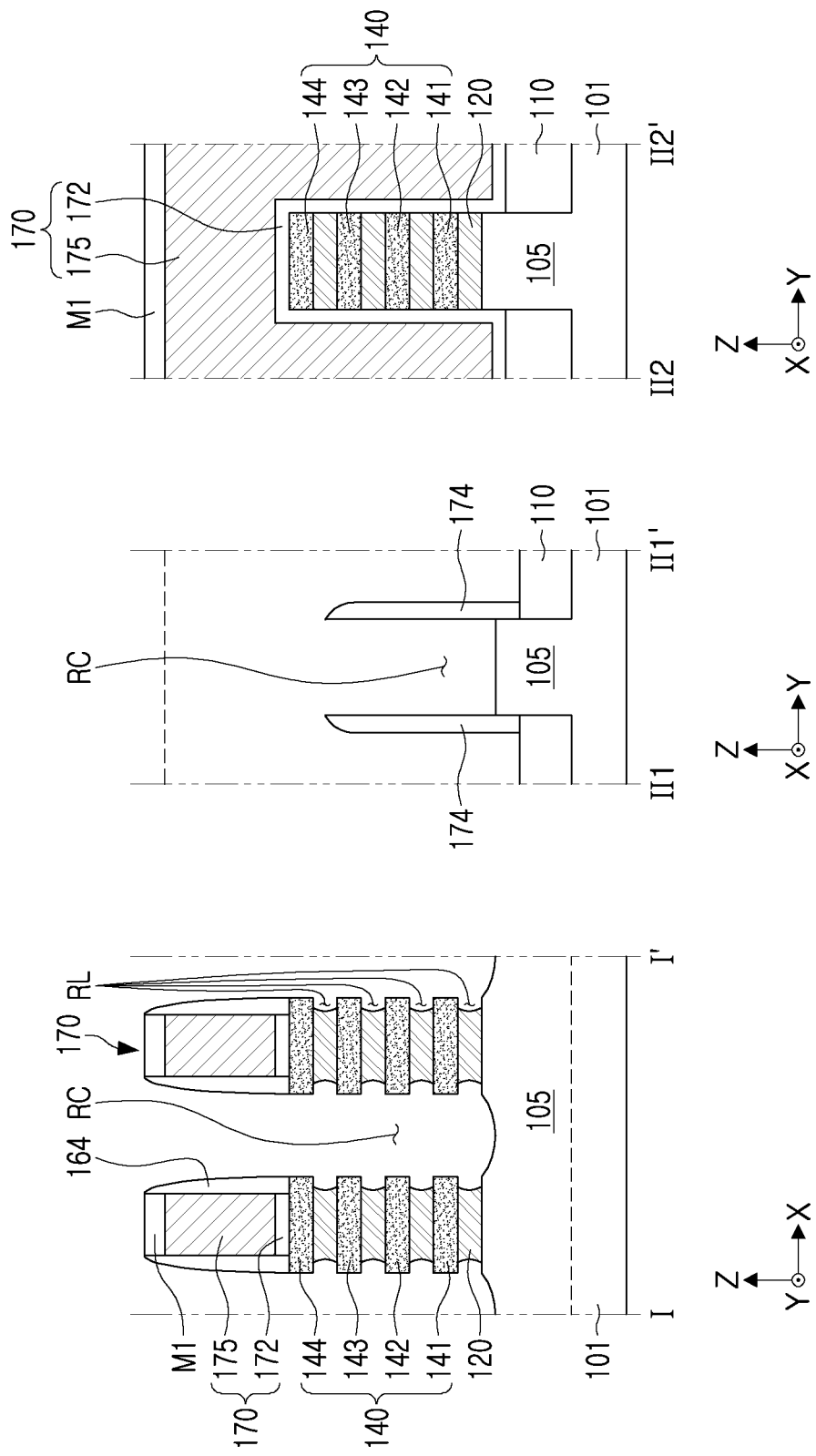
Figure 11:
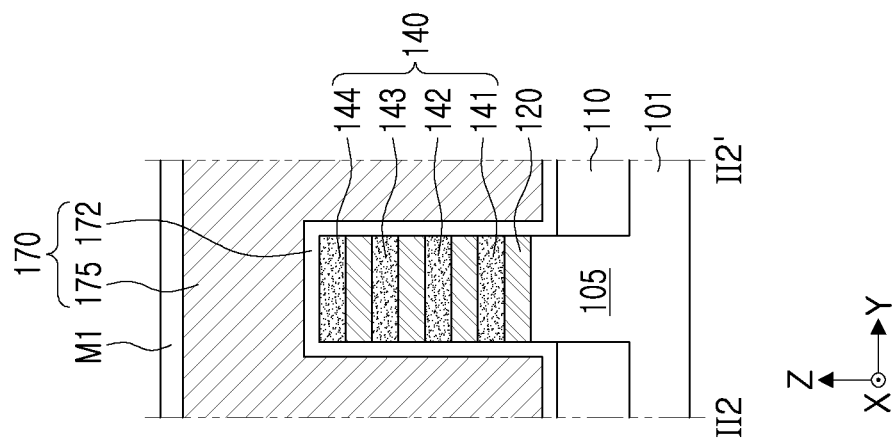
Figure 11:
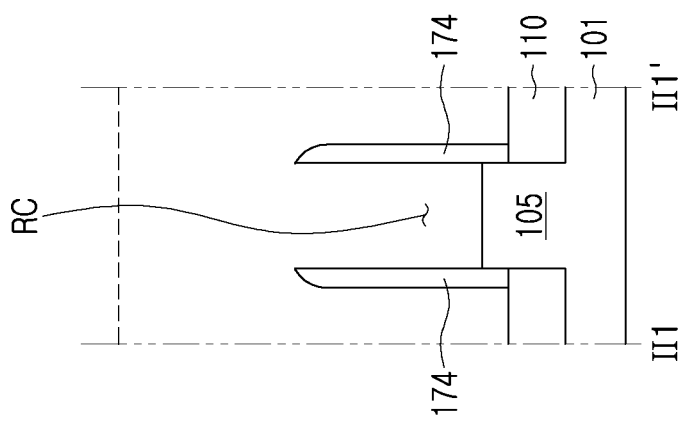
Figure 11:
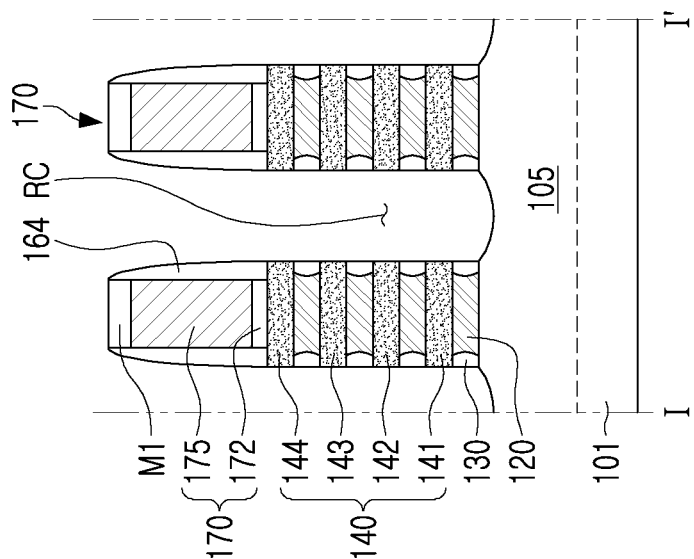

Next, referring to FIG. 10, a portion of the exposed sacrificial layers 120 may be removed from both side surfaces exposed in the first direction (e.g., the X-direction). Referring to FIG. 11, internal spacers 130 may be formed in the portion from which the sacrificial layers 120 are removed.

The sacrificial layers 120 may be selectively etched with respect to the channel structures 140 by, for example, a wet etching process, and laterally removed to a predetermined depth in the first direction (e.g., the X-direction). The sacrificial layers 120 may have inwardly concave side surfaces RL by lateral etching as described above. Shapes of the side surfaces of the sacrificial layers 120 are not limited to those illustrated above.

The internal spacers 130 may be formed by filling an insulating material in a region from which the sacrificial layers 120 are removed and removing a portion of the insulating material deposited outside the channel structures 140. The internal spacers 130 may be formed of the same material as the gate spacers 164, but the present inventive concept is not limited thereto. For example, the internal spacers 130 may include at least one of SiN, SiCN, SiOCN, SiBCN, or SiBN.

Figure 12:
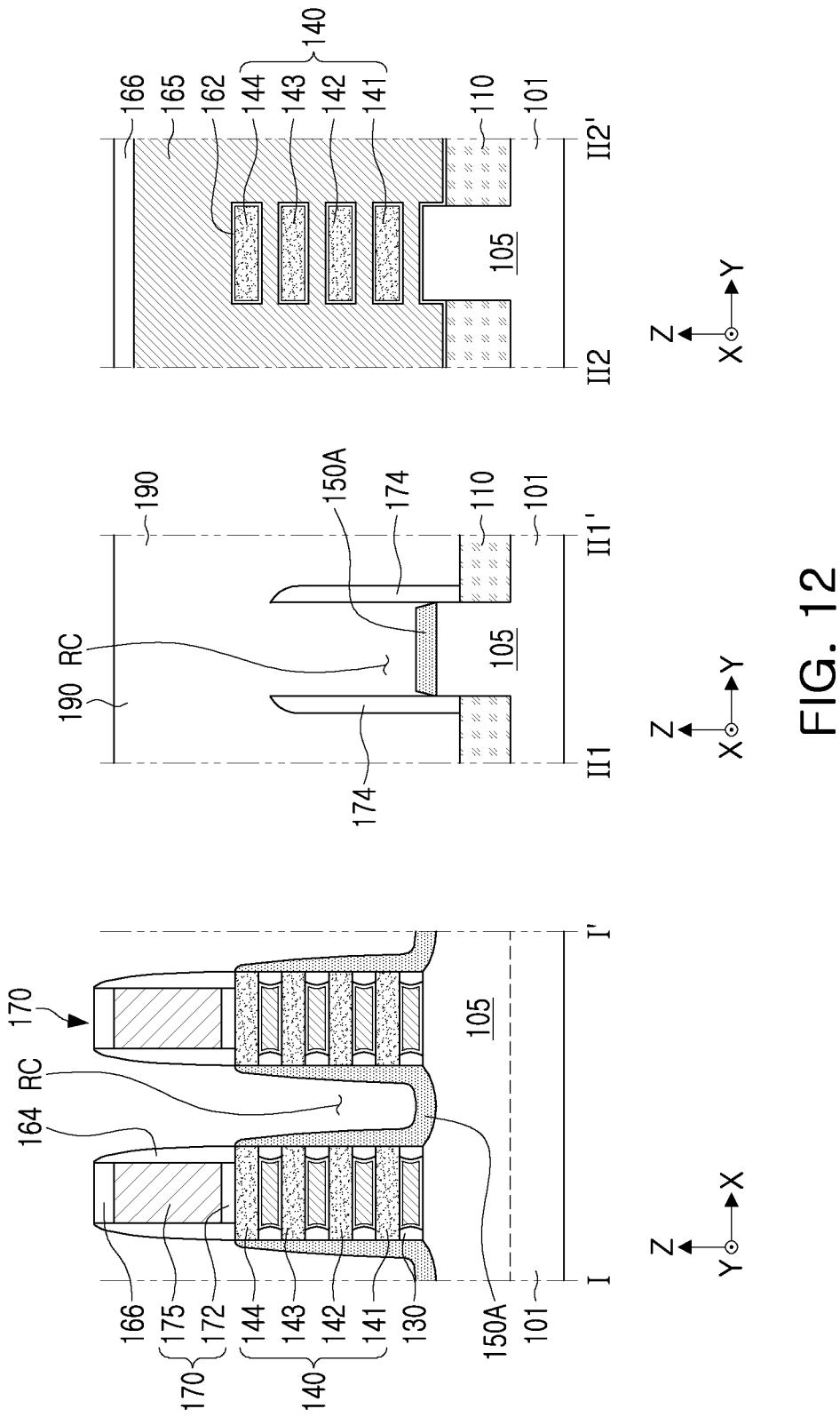

Next, referring to FIG. 12, a first epitaxial layer 150A for forming source/drain regions may be formed in the recesses RC located on both sides of the sacrificial gate structures 170.

The first epitaxial layer 150A may be formed of silicon germanium (SiGe) by an SEG process. A first composition ratio of germanium (Ge) in the first epitaxial layer 150A may be 5% to 15%, and may be grown from an upper surface region of a fin-type active region 105, which may be a bottom surface of the recess RC, and side surfaces of the channel layers 141, 142, 143, and 144. For example, the first epitaxial layer 150A may grow in a <100> plane direction from the upper surface region of the fin-type active region 105, and may grow in a <110> plane direction from the side surfaces of the channel layers 141, 142, 143, and 144. In some embodiments, portions formed from side surfaces of adjacent channel layers 141, 142, 143, and 144 by controlling the growth process conditions may be merged with each other, to continuously grow the first epitaxial layer 150A along a sidewall of the recess RC. Such growth conditions may be obtained, for example, by adjusting a growth pressure, a growth temperature, and/or a gas flow rate.

Figure 13:
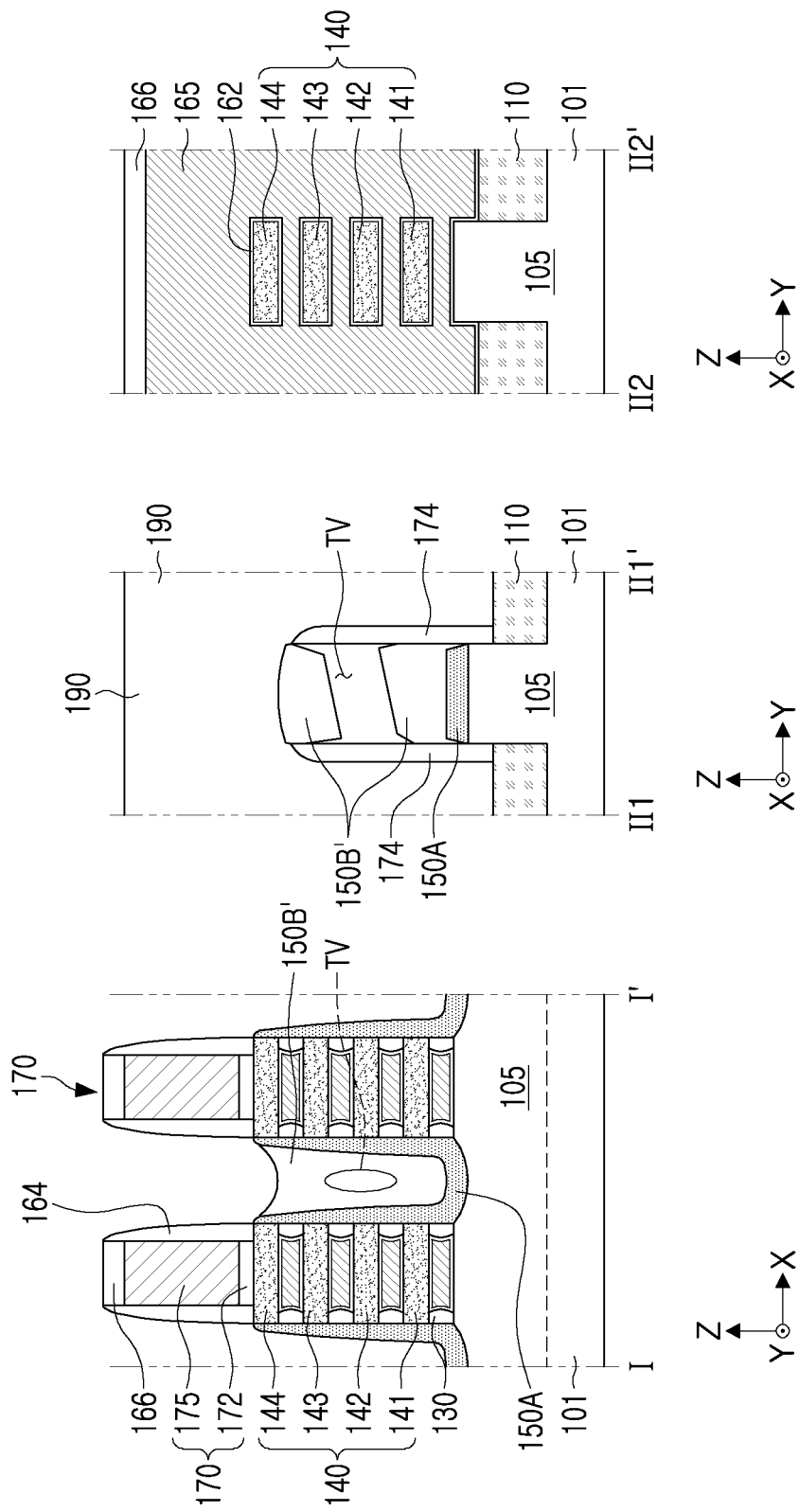
Figure 14:
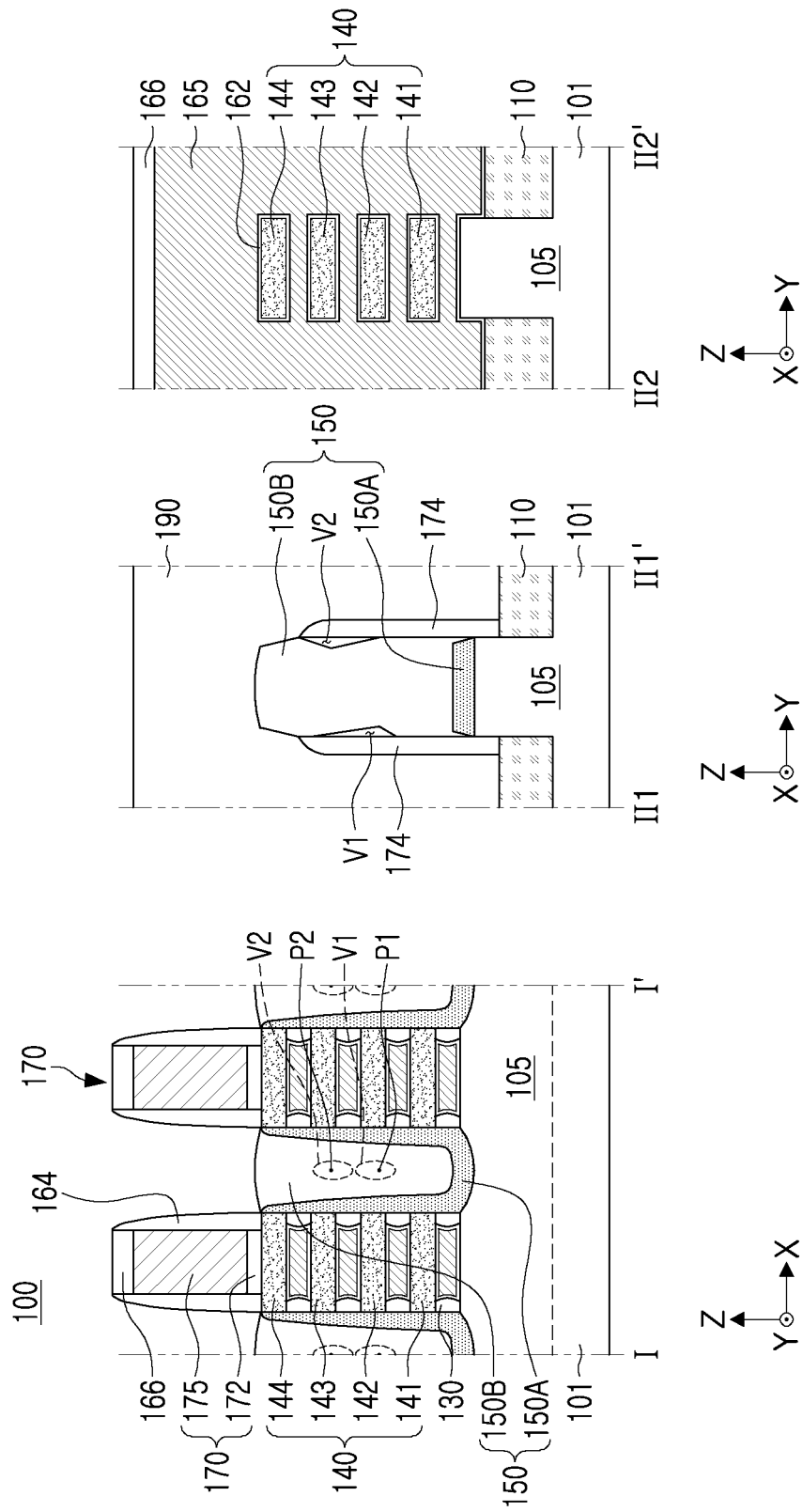

Referring to FIGS. 13 and 14, a process of forming a second epitaxial layer 150B on the first epitaxial layer 150A may be illustrated.

First, referring to FIG. 13, a second epitaxial 150B' having an intermediate through-region TV may be formed on the first epitaxial layer 150A.

The second epitaxial 150B' may be grown from the first epitaxial layer 150A using an SEG process. The second epitaxial 150B' may include silicon germanium including Ge having a second composition ratio, higher than the first composition ratio of the first epitaxial layer 150A. For example, a Ge composition ratio of SiGe, which may be the second epitaxial 150B', may be 20% or more. In the second epitaxial 150B', a portion that reacts first in the <110> plane direction around an inlet of the recess RC before reaction gas reaches the bottom surface of the recess RC may increase. The growth around the bottom surface of the recess RC in the <100> plane direction may be performed at a slow speed due to an increase in stress in a relatively narrow area. As a result, as illustrated in FIG. 11, the second epitaxial 150B' grown in the <110> plane direction may be merged around the inlet of the recess RC to generate the intermediate through-region TV, a pinch-off void. The intermediate through-region TV may have a structure opened to face the fence spacers 174. As in the present embodiment, when the aspect ratio of the recess RC is large, merging for forming the intermediate through-region TV may be performed faster.

Next, referring to FIG. 14, a second epitaxial layer 150B may be formed on the first epitaxial layer 150A by a continuous epitaxial growth process, to obtain a desired source/drain region 150.

Although the intermediate through-region TV is filled by this process, since reactive gas may not be smoothly supplied in the lateral direction by the fence spacers 174, concave voids V1 and V2, not completely filled, may be formed in each of both side surfaces of the source/drain region 150. In this incomplete filling process, since epitaxial portions may be merged in different directions, dislocation defect points P1 and P2 may be observed in each of the voids V1 and V2.

The source/drain regions 150 formed in the present embodiment may have an asymmetrical shape in right and left directions. Specifically, the voids V1 and V2 located on both sides to face each of the fence spacers 174 may be located on different levels, and may have different shapes and/or sizes. The second epitaxial layer 150B may have a relatively flat or slightly convex upper surface.

Figure 15:
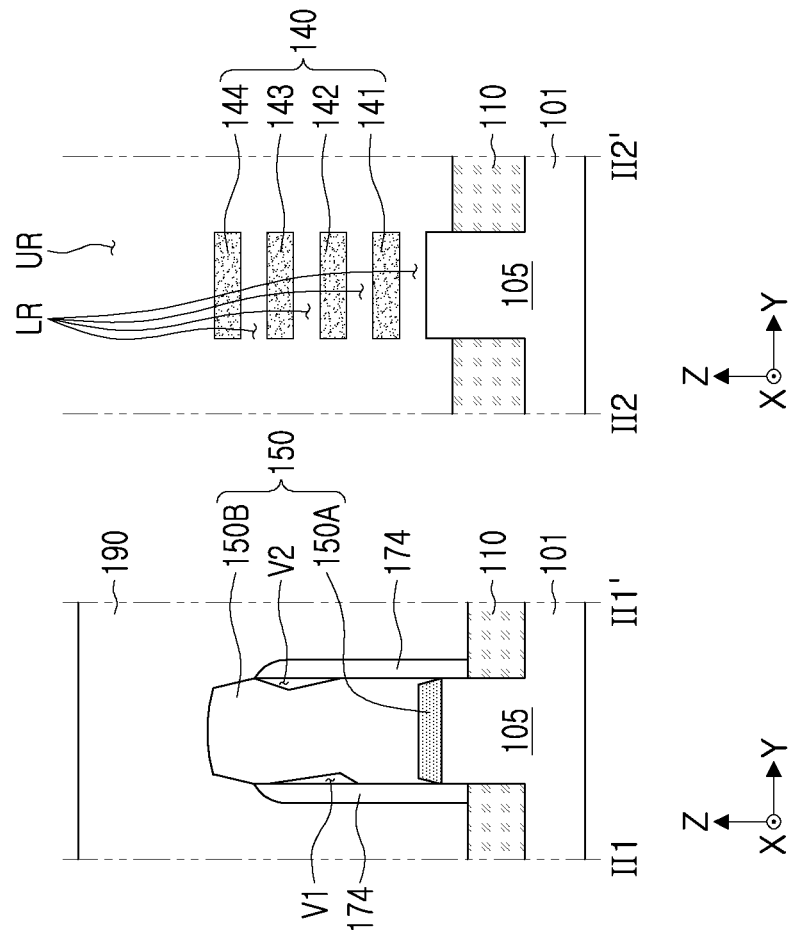
Figure 15:
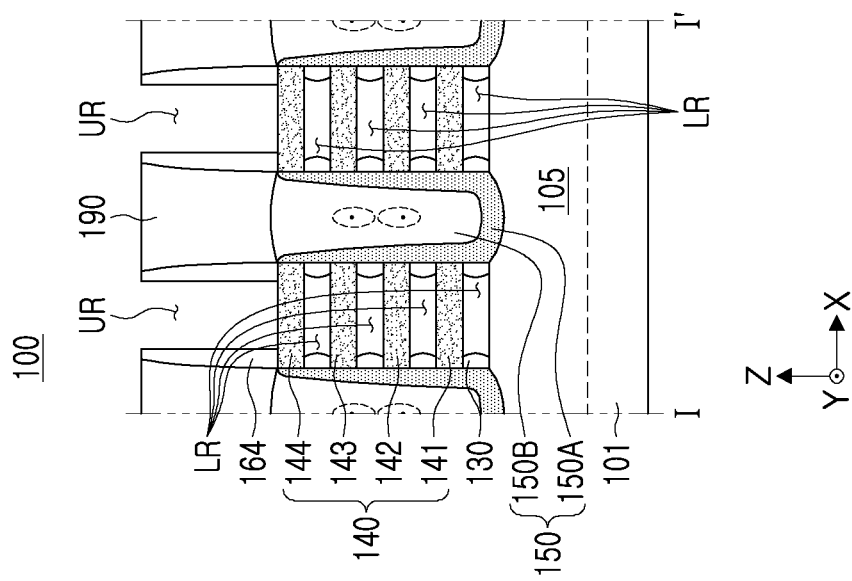

Next, referring to FIG. 15, an interlayer insulating layer 190 may be formed, and the sacrificial layers 120 and the sacrificial gate structures 170 may be removed to form upper gap regions UR and lower gap regions LR.

The interlayer insulating layer 190 may be prepared by forming an insulating layer covering or overlapping the sacrificial gate structures 170 and the source/drain regions 150 and performing a planarization process. The sacrificial layers 120 and the sacrificial gate structure 170 may be selectively removed with respect to the gate spacers 164, the interlayer insulating layer 190, and the channel structure 140. First, the upper gap regions UR may be formed by removing the sacrificial gate structures 170 together with the second mask pattern M2, and then the sacrificial layers 120 exposed through the upper gap regions UR may be removed, to form the lower gap regions LR. For example, when the sacrificial layers 120 include silicon germanium (SiGe) and the channel structure 140 includes silicon (Si), the sacrificial layers 120 may be selectively removed by performing a wet etching process using peracetic acid as an etchant. During the removal process, the source/drain regions 150 may be protected by the interlayer insulating layer 190 and the internal spacers 130.

Figure 16:
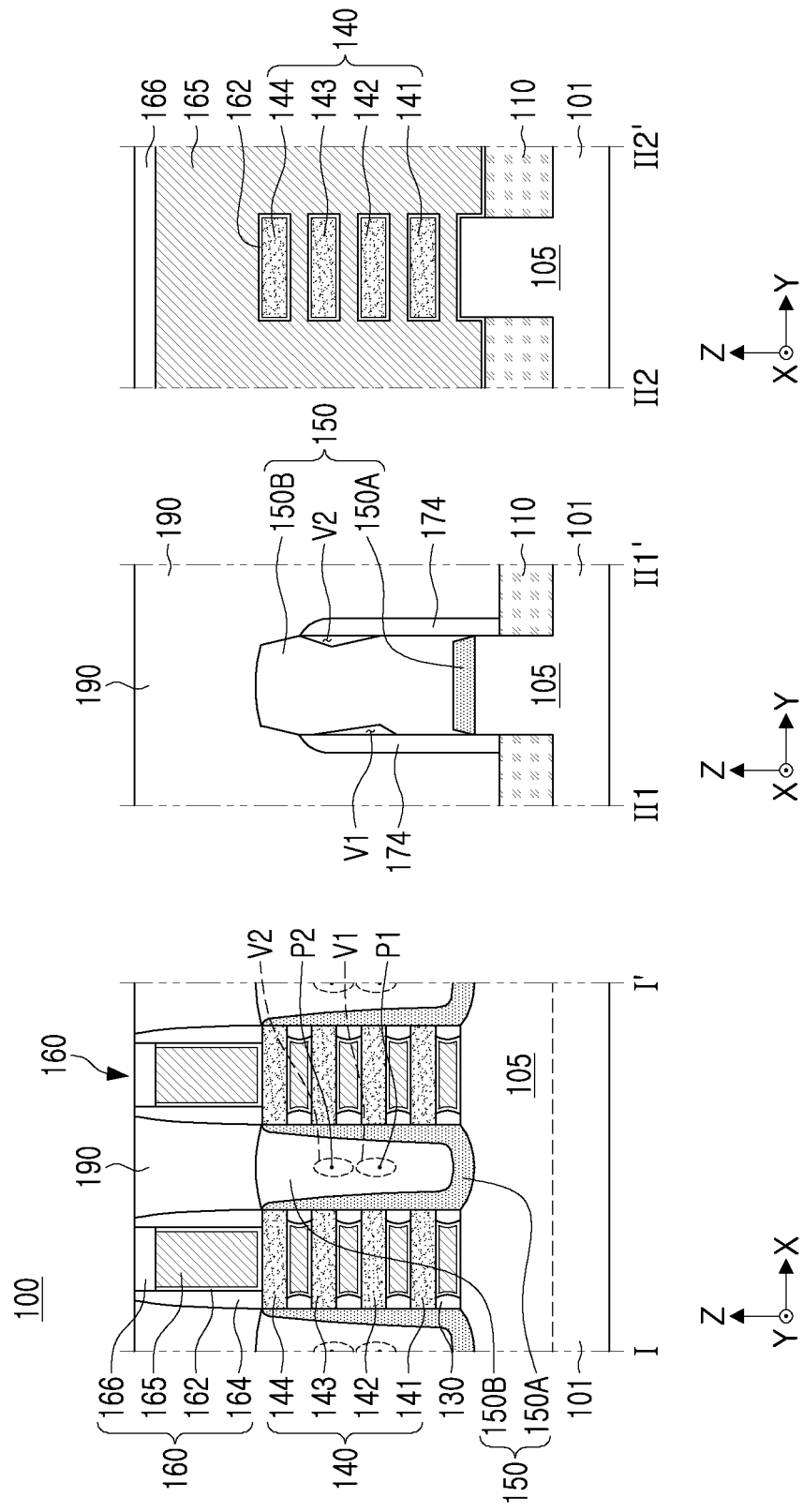

Next, referring to FIG. 16, gate structures 160 may be formed in the upper gap regions UR and the lower gap regions LR.

Gate dielectric layers 162 may be formed to conformally cover inner surfaces of the upper gap regions UR and inner surfaces of the lower gap regions LR. Gate electrodes 165 may be formed to completely fill the upper gap regions UR and the lower gap regions LR, and upper portions of the gate electrodes 165 in the upper gap regions UR may be removed by a predetermined depth. A gate capping layer 166 may be formed in a region from which the upper portions of the gate electrodes 165 in the upper gap regions UR are removed. By these processes, the gate structures 160 including the gate dielectric layer 162, the gate electrode 165, the gate spacers 164, and the gate capping layer 166 may be formed.

Next, the semiconductor device 100 illustrated in FIGS. 2 to 3B may be manufactured by forming a contact plug 180 passing through the interlayer insulating layer 190 and connected to the source/drain region 150. A contact hole connected to the source/drain region 150 that passes through the interlayer insulating layer 190 may be formed, and a conductive material may be buried in the contact hole to form the contact plug 180. A lower surface of the contact hole may be recessed into the source/drain regions 150 or may have a curve along upper surfaces of the source/drain regions 150.

Figure 17A:
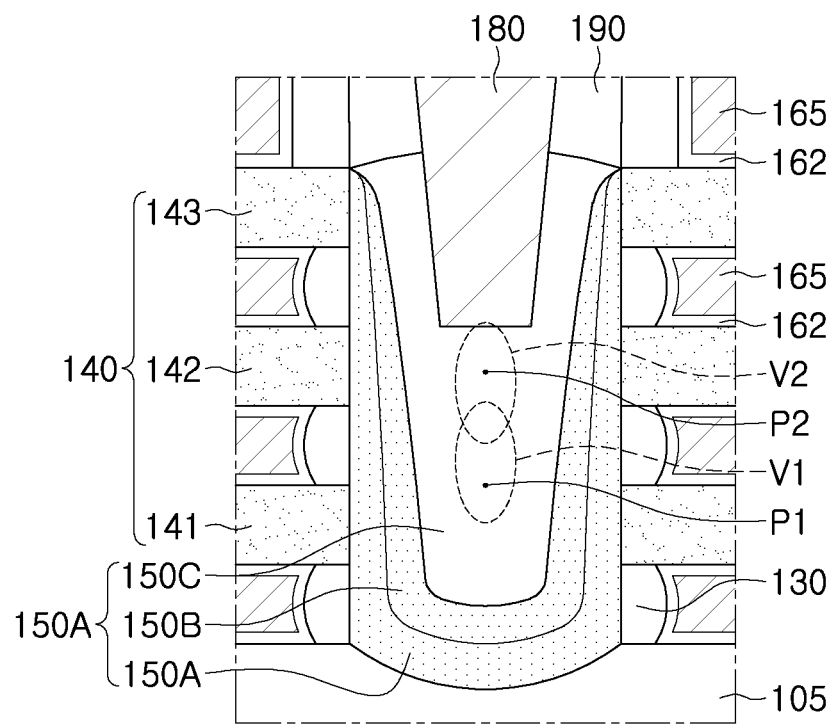
FIGS. 17A and 17B are cross-sectional views illustrating a semiconductor device according to some embodiments.
Figure 17B:
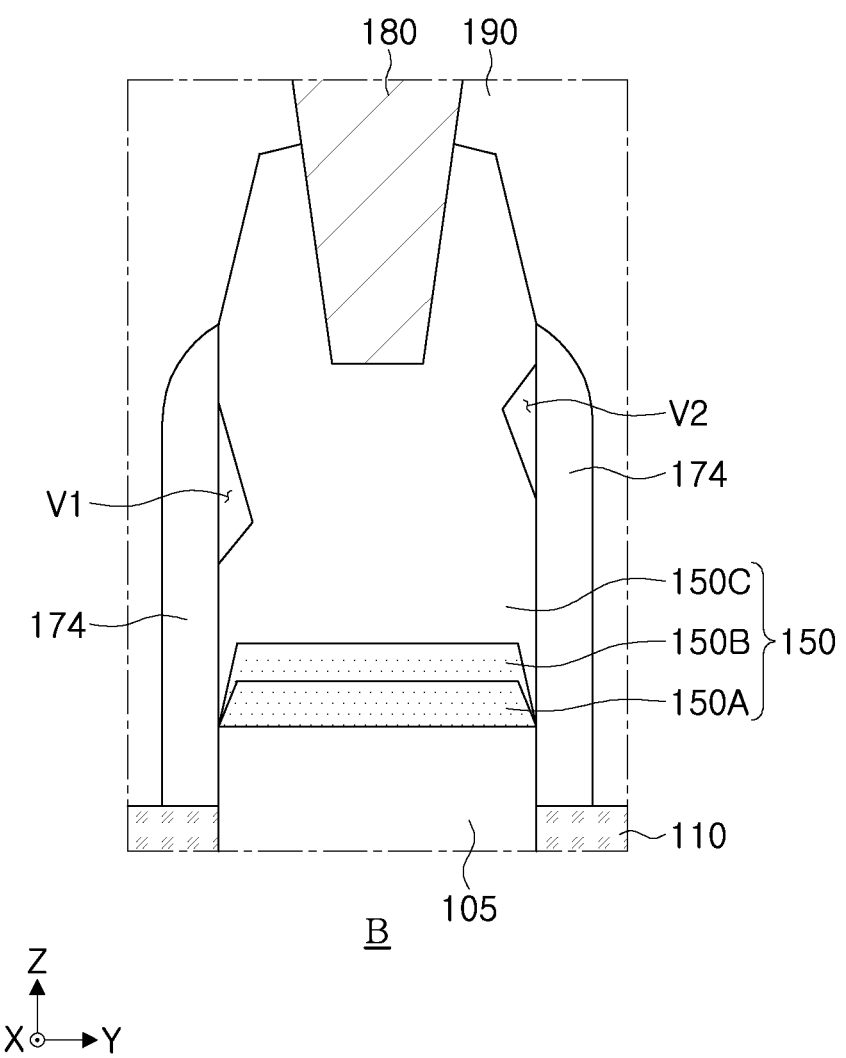

FIGS. 17A and 17B are cross-sectional views illustrating a semiconductor device according to an embodiment. The cross-sectional views of FIGS. 17A and 17B can be understood as regions corresponding to the cross-sectional views of FIGS. 4A and 4B, respectively.

Referring to FIGS. 17A and 17B, it can be understood that a semiconductor device 100A according to the present embodiment is similar to the semiconductor device 100 illustrated in FIGS. 1 to 4, except that a channel structure 140 includes three channel layers 141, 142, and 143, and source/drain regions include a first epitaxial layer 150A, a second epitaxial layer 150B, and a third epitaxial layer 150C. In addition, components of the present embodiment may be understood with reference to descriptions of the same or similar components of the semiconductor device 100 illustrated in FIGS. 1 to 4, unless otherwise specified.

The channel structure 140 employed in the present embodiment may include three channel layers 141, 142, and 143. When the number of channel layers is small, the channel structure 140 may have a relatively low aspect ratio, but due to fence spacers 174 having relatively high heights during a growth process of a source/drain region 150, reactive gas may not be smoothly supplied in the lateral direction, Therefore, an intermediate through-region ("TV" in FIG. 13) described above may not be completely filled. As a result, the source/drain region 150 employed in the present embodiment may have voids V1 and V2 formed in both side surfaces facing the fence spacers 174A, respectively.

The source/drain region 150 employed in the present embodiment may include a first epitaxial layer 150A disposed on the fin-type active region 105 and may extend onto side surfaces of the plurality of channel layers 141, 142, and 143 in the first direction, a second epitaxial layer 150B disposed on the first epitaxial layer 150A and having a composition, different from a composition of the first epitaxial layer 150A, and a third epitaxial layer 150C disposed on the second epitaxial layer 150B and having a composition or impurity concentration, different from that of the second epitaxial layer 150B.

For example, the first epitaxial layer 150A may include silicon, or may include silicon germanium having germanium in a relatively low composition ratio, and the second epitaxial layer 150B may include silicon germanium having germanium in a relatively high composition ratio. Also, the third epitaxial layer 150C may include silicon germanium having germanium in a relatively higher composition ratio or may include silicon germanium having other impurity concentrations. In the present embodiment, the third epitaxial layer 150C may provide a region connected to a contact plug 180, and the voids V1 and V2 may be formed in both side surfaces of the third epitaxial layer 150C, respectively.

Figure 18:
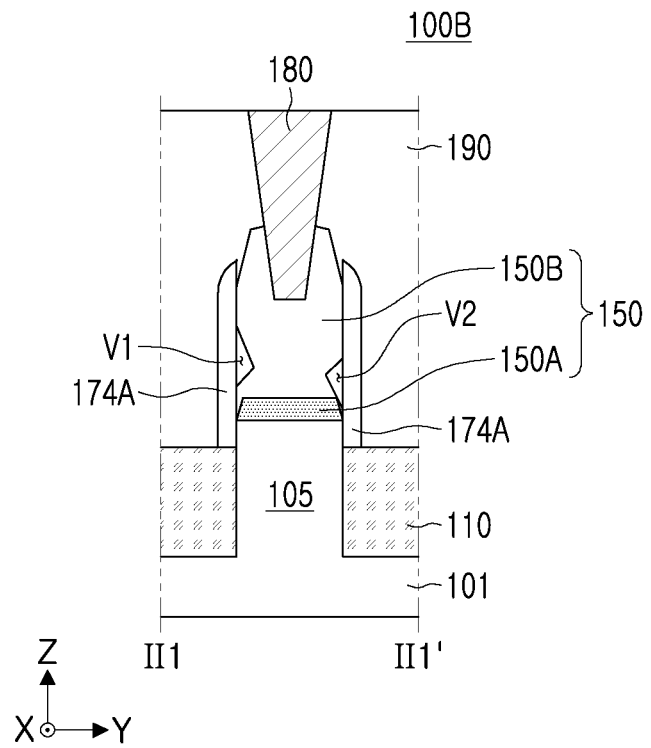
FIGS. 18 and 19 are cross-sectional views illustrating semiconductor devices according to various embodiments of the present inventive concept.
Figure 19:
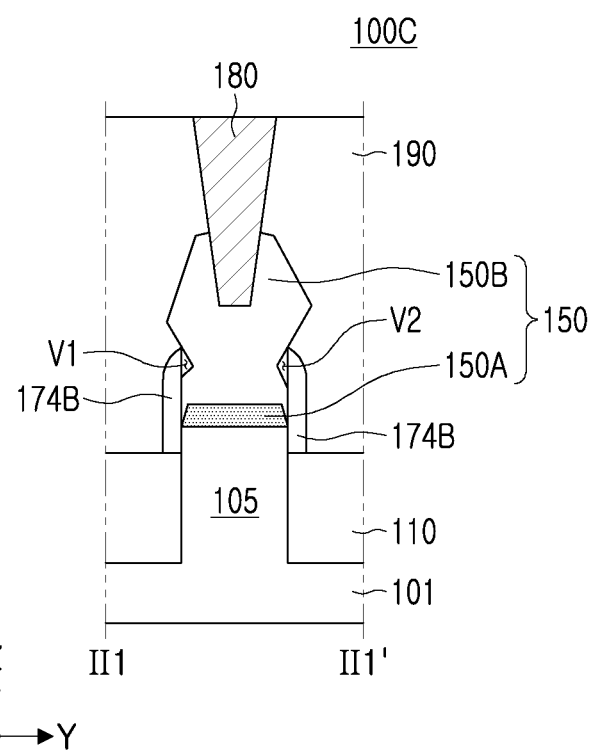

FIGS. 18 and 19 are cross-sectional views illustrating semiconductor devices according to various embodiments of the present inventive concept.

Referring to FIG. 18, it can be understood that a semiconductor device 100B according to the present embodiment is similar to the semiconductor device 100 illustrated in FIGS. 1 to 4, except that fence spacers 174A have relatively high heights and positions and arrangement of voids V1 and V2 in a source/drain region 150 are changed. In addition, components of the present embodiment may be understood with reference to descriptions of the same or similar components of the semiconductor device 100 illustrated in FIGS. 1 to 4, unless otherwise specified.

The fence spacers 174A employed in the present embodiment may have heights, higher than heights of the fence spacers 174 introduced in the previous embodiments. The positions and arrangements of the voids V1 and V2 may be variously changed by the fence spacers 174A having relatively high heights. As illustrated in FIG. 18, in the present embodiment, the voids V1 and V2 may be disposed on a relatively low position in a side surface of the source/drain region 150, and, in a cross-sectional view in the second direction (e.g., the Y-direction), a shape of the source/drain region 150 may have an asymmetric structure that is different from that of the previous embodiment.

Referring to FIG. 19, it can be understood that a semiconductor device 100C according to the present embodiment is similar to the semiconductor device 100 illustrated in FIGS. 1 to 4, except that fence spacers 174B have a relatively low height and an upper region of a source/drain region 150 has a width that is wider than an interval between the fence spacers 174B. In addition, components of the present embodiment may be understood with reference to descriptions of the same or similar components of the semiconductor device 100 illustrated in FIGS. 1 to 4, unless otherwise specified.

The fence spacers 174B employed in the present embodiment may have heights, lower than the heights of the fence spacers 174 introduced in the previous embodiment. Positions and arrangement of voids V1 and V2 as well as a cross-sectional shape of the source/drain region 150 may be changed by the fence spacers 174B having relatively low heights. In a cross-sectional view in the second direction (e.g., the Y-direction), the shape of the source/drain region 150 employed in the present embodiment has an asymmetric structure that is different from that of the previous embodiments. For example, as illustrated in FIG. 19, the voids V1 and V2 may be formed on different positions of side surfaces facing the fence spacers 174B. In addition, a width of a lower region of the source/drain region 150 in the second direction (e.g., the Y-direction) may be defined by a distance between the fence spacers 174B, but unlike the previous embodiment, an upper region of the source/drain region 150 may have a width that is greater than an interval between the fence spacers 174B.

In a semiconductor device according to the present inventive concept, a width of a source/drain region may be controlled by introducing fence spacers having relatively high heights. In addition, concave voids may be respectively formed in both side surfaces opposing the fence spacers in the source/drain region.

Various advantages and effects of the present inventive concept are not limited to the above, and will be more easily understood in the process of describing specific embodiments of the present inventive concept.

While example embodiments have been illustrated and described above, it will be apparent to those skilled in the art that modifications and variations could be made without departing from the scope of the present inventive concept as defined by the appended claims.

What is claimed is:

1. A semiconductor device, comprising:
an active region protruding from a substrate in a vertical direction perpendicular to the substrate and extending in a first direction perpendicular to the vertical direction;
a plurality of channel layers disposed above the active region, the plurality of channel layers being spaced apart from each other in the vertical direction;
a gate structure intersecting the active region, along a second direction that is perpendicular to the first direction and the vertical direction, the gate structure surrounding each of the plurality of channel layers in a plane perpendicular to the first direction;
fence spacers disposed on side surfaces of the active region and on sides of the gate structure, wherein the fence spacers extend in the vertical direction; and
a source/drain region disposed between the fence spacers on the active region,
wherein the source/drain region is connected to each of the plurality of channel layers, and
wherein the source/drain region includes a plurality of voids in side surfaces of the source/drain region disposed adjacent to the fence spacers, and the source/drain region has a laterally asymmetric shape in a cross-section along the first direction due to an arrangement of the plurality of voids.

2. The semiconductor device of claim 1, wherein each of the fence spacers has a height that is about 30% or more of a height of the source/drain region in the vertical direction.

3. The semiconductor device of claim 1, wherein each of the fence spacers has a height in the vertical direction of about 30 nm or more.

4. The semiconductor device of claim 1, wherein:
the gate structure further comprises a gate spacer on a side surface of the gate structure, the gate spacer extending in the vertical direction; and
the fence spacers comprise a same material as a material of the gate spacer.

5. The semiconductor device of claim 1, wherein an aspect ratio of a height of the source/drain region to a width of the source/drain region is about 2.5 or more.

6. The semiconductor device of claim 1, wherein the plurality of voids includes a first void adjacent to one of the fence spacers and a second void adjacent to the other of the fence spacers, the first void and the second void being different from each other in terms of at least one of their shape or level.

7. The semiconductor device of claim 1, wherein the plurality of voids in the side surfaces of the source/drain region are disposed at different heights in the vertical direction.

8. The semiconductor device of claim 1, wherein the source/drain region comprises:
a first epitaxial layer disposed above the active region, the first epitaxial layer extending onto side surfaces of the plurality of channel layers in the vertical direction; and
a second epitaxial layer disposed above the first epitaxial layer, the second epitaxial layer having a composition different from a composition of the first epitaxial layer.

9. The semiconductor device of claim 8, wherein the voids are disposed in the second epitaxial layer.

10. The semiconductor device of claim 8, wherein:
the first epitaxial layer comprises silicon germanium having germanium in a first composition ratio; and
the second epitaxial layer comprises silicon germanium having germanium in a second composition ratio higher than the first composition ratio.

11. The semiconductor device of claim 1, wherein the source/drain region comprises:
a first epitaxial layer disposed above the active region, the first epitaxial layer extending onto side surfaces of the plurality of channel layers in the vertical direction;
a second epitaxial layer disposed above the first epitaxial layer, the second epitaxial layer having a composition different from a composition of the first epitaxial layer; and
a third epitaxial layer disposed above the second epitaxial layer, the third epitaxial layer having a composition or impurity concentration different from the composition of impurity concentration of the second epitaxial layer.

12. The semiconductor device of claim 11, wherein the plurality of voids are disposed in the third epitaxial layer.

13. The semiconductor device of claim 1, further comprising:
  internal spacers disposed on side surfaces of the gate structure in the first direction and below a lower surface of each of the plurality of channel layers in the vertical direction.

14. A semiconductor device, comprising:
  an active region protruding from a substrate in a vertical direction perpendicular to the substrate, the active region extending in a first direction perpendicular to the vertical direction;
  a plurality of channel layers disposed above the active region, the plurality of channel layers being spaced apart from each other in the vertical direction;
  a gate structure intersecting the active region, along a second direction that is perpendicular to the first direction and the vertical direction, the gate structure surrounding each of the plurality of channel layers in a plane perpendicular to the first direction;
  a source/drain region comprising:
    a first epitaxial layer disposed above the active region, the first epitaxial layer extending onto side surfaces of the plurality of channel layers in the vertical direction; and
    a second epitaxial layer disposed above the first epitaxial layer, the second epitaxial layer having a composition different from a composition of the first epitaxial layer; and
  fence spacers disposed on side surfaces of the active region and on sides of the gate structure, wherein the fence spacers extend in the vertical direction,
  wherein:
    the source/drain region has a first portion extending above the fence spacers in the vertical direction and a second portion between the fence spacers, the second portion having a shape that is asymmetrically disposed relative to the active region in the plane perpendicular to the first direction;
    the source/drain region includes a plurality of voids in side surfaces of the source/drain region disposed adjacent to the fence spacers, a first void of the plurality of voids being adjacent to one of the fence spacers, a second void of the plurality of voids being adjacent to the other of the fence spacers, the first void and the second void being different from each other in terms of at least one of their shape or level, and the source/drain region has a laterally asymmetric shape in a cross-section along the first direction due to an arrangement of the plurality of voids;
    an aspect ratio of a height of the source/drain region to a width of the source/drain region is about 2.5 or more; and
    each of the fence spacers has a height that is about 30% or more of a height of the source/drain region in the vertical direction.

15. The semiconductor device of claim 14, wherein:
  the side surfaces of the source/drain region are portions of the second epitaxial layer.

16. The semiconductor device of claim 15, wherein the plurality of voids in the side surfaces of the source/drain region are disposed at different heights in the vertical direction.

17. The semiconductor device of claim 14, wherein an aspect ratio of a height of the second epitaxial layer to a width of the second epitaxial layer is 2 or more.

18. The semiconductor device of claim 14, wherein a height of each of the fence spacers is at least about 50% of a height of the source/drain region in the vertical direction.

* * * * *